(12) United States Patent
Oigawa et al.

(10) Patent No.: US 8,625,191 B2
(45) Date of Patent: Jan. 7, 2014

(54) WAVELENGTH-TUNABLE LIGHT SOURCE APPARATUS

(75) Inventors: Makoto Oigawa, Kawasaki (JP); Furusawa Kentaro, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 390 days.

(21) Appl. No.: 12/987,816

(22) Filed: Jan. 10, 2011

(65) Prior Publication Data

US 2011/0170110 A1 Jul. 14, 2011

(30) Foreign Application Priority Data

Jan. 13, 2010 (JP) ................................. 2010-005182

(51) Int. Cl.
*H01S 3/098* (2006.01)
*H01S 5/00* (2006.01)

(52) U.S. Cl.
USPC ............... 359/340; 359/344; 372/18; 372/25; 372/28

(58) Field of Classification Search
USPC .................... 359/340, 344; 372/18, 25, 28
See application file for complete search history.

(56) References Cited

U.S. PATENT DOCUMENTS

| | | | | |
|---|---|---|---|---|
| 6,134,003 | A * | 10/2000 | Tearney et al. | 356/479 |
| 7,027,468 | B2 * | 4/2006 | Krastev et al. | 372/6 |
| 7,646,985 | B2 * | 1/2010 | Arahira | 398/155 |
| 2003/0128414 | A1 * | 7/2003 | Watanabe et al. | 359/237 |
| 2004/0005153 | A1 * | 1/2004 | Watanabe | 398/148 |
| 2007/0189777 | A1 * | 8/2007 | Arahira | 398/155 |

FOREIGN PATENT DOCUMENTS

| | | |
|---|---|---|
| JP | 2009-277754 A | 11/2009 |
| WO | 2005/006508 A1 | 1/2005 |

OTHER PUBLICATIONS

Schares et al. "Picosecond, wavelength tunable SOA-based laser sources at 10-40 GHz Repetition rates", Pacific Rim Conference on Lasers and Electro-Optics, CLEO-technical digest, IEEE, pp. 56-57, (Dec. 1, 2002).*
Website http://www.rp-photonics.com/gain_switching.html, accessed by Examiner on Mar. 28, 2013.*
Zoiros et al. "Design optimization of all-optical actively mode-locked ring laser based on cross-gain modulation in a semiconductor optical amplifier", Optik, vol. 115, No. 12, pp. 552-563, (2004).*
Shinji Yamashia, et al., "Wide and fast wavelength-tunable mode-locked fiber laser based on dispersion tuning", Optics Express (journal), Oct. 2, 2006, pp. 9299-9306, vol. 14, No. 20, Publisher: Optical Society of America, Washington, DC, USA.

(Continued)

*Primary Examiner* — Eric Bolda
(74) *Attorney, Agent, or Firm* — Canon USA, Inc., IP Division

(57) ABSTRACT

A wavelength-tunable light source apparatus includes a first light source apparatus and a second light source apparatus. The first light source apparatus is capable of changing an oscillation wavelength and includes a resonator. The resonator includes an optical amplification medium for amplifying light and a waveguide having wavelength distribution. The second light source apparatus is connected to the waveguide and configured to introduce pulsed light as modulation light to the first light source apparatus. The oscillation wavelength is controlled by active mode locking employing cross-gain modulation using the modulation light. The pulse width of the modulation light has a duration shorter than a duration of a half period of a driving signal for generating the modulation light.

20 Claims, 13 Drawing Sheets

(56) References Cited

OTHER PUBLICATIONS

Osamu Kusakari, Shinji Yamashia, "Wavelength Tunable Laser using Dispersion Tuning via Cross-Gain Modulation", Electronics Society Convention 2009, Sep. 15-18, 2009, p. 252, C-4-14, Publisher: The Institute of Electronics, Information and Communication Engineers, Tokyo, Japan.

Kyriakos Vlachos, "Ultrafast Semiconductor-Based Fiber Laser Sources"; IEEE Journal of Selected Topics in Quantum Electronics, Jan./Feb. 2004, pp. 147-154, vol. 10, No. 1, IEEE Photonics Society, Piscataway, NJ, United States.

\* cited by examiner

WAVELENGTH-TUNABLE LIGHT SOURCE APPARATUS

BACKGROUND OF THE INVENTION

1. Field of the Invention

The present invention relates to a wavelength-tunable light source apparatus using active mode locking that employs cross gain modulation.

2. Description of the Related Art

In recent years, light sources in which wavelengths can be changed at high-speed wavelength sweep rates on the order of several hundred kHz to several MHz in a wide wavelength sweep width range of several hundred nanometers have been researched and developed.

One of them is a dispersion tuning technique based on active mode locking using wavelength dispersion of refractive index in a resonator (hereinafter also referred to simply as "dispersion") is disclosed in S. Yamashita, et al., Opt. Exp. Vol. 14, pp. 9299-9306 (2006) (hereinafter referred to as "Non Patent Literature 1").

The technique disclosed in Non Patent Literature 1 utilizes the fact that free spectral range (FSR) (free frequency space) varies with a wavelength when dispersion is present in a resonator.

Specifically, a technique is disclosed for changing an oscillation wavelength by changing a modulation frequency by utilizing the fact that a modulation frequency varies with a central wavelength at which a laser oscillates to directly modulate an electric current to be injected into a semiconductor optical amplifier (SOA) forming a laser and to obtain active mode locking.

Proceedings of the Institute of Electronics, Information and Communication Engineers (IEICE) Electronics Society Conference 2009, C-4-14 (hereinafter referred to as "Non Patent Literature 2") disclose the use of cross-gain modulation employing external light, not using modulation of an electric current to be injected into a gain medium (SOA), to obtain active mode locking.

With the above-described dispersion tuning, because a wavelength tuning operation uses differences of mode locking frequency, in terms of stability of each varying laser oscillation frequency to the time axis, determination accuracy in a modulation frequency is important. Accordingly, a modulation method with reduced temporal variation (displacement) or fluctuation in a signal (hereinafter also referred to as "jitter") is desired.

The technique of Non Patent Literature 1 modulates an electric current for driving a gain medium, whereas that of Non Patent Literature 2 performs modulation using light modulated from continuous light generated by a semiconductor laser (laser diode (LD)) by an electro-optic modulator (EOM).

However, the techniques disclosed in the above Non Patent Literatures are a modulation method by which the shape of an electric current waveform subjected to electrical modulation is mirrored, so it is difficult to reduce jitter occurring in generation of an electric current and thus further improvement is required.

SUMMARY OF THE INVENTION

An embodiment includes a wavelength-tunable light source apparatus. The wavelength-tunable light source apparatus includes a first light source apparatus and a second light source apparatus. The first light source apparatus changes an oscillation wavelength and includes a resonator. The resonator includes an optical amplification medium for amplifying light and a waveguide having wavelength distribution. The second light source apparatus is connected to the waveguide and introduces pulsed light as modulation light to the first light source apparatus. The oscillation wavelength is controlled by active mode locking employing cross-gain modulation using the modulation light. The pulse width of the modulation light has a duration shorter than a duration of a half period of a driving signal for generating the modulation light.

Further features of the present invention will become apparent from the following description of exemplary embodiments with reference to the attached drawings.

DESCRIPTION OF THE EMBODIMENTS

The embodiments are based on finding of the inventors that a wavelength-tunable operation with improved jitter characteristics of modulation frequency and excellent wavelength selectivity is enabled by performing active mode-locking operation using cross-gain modulation employing pulsed light having a narrow duration and performing dispersion tuning.

With an embodiment, a wavelength-tunable light source apparatus capable of reducing temporal variation (displacement) or fluctuation in a signal by the use of cross-gain modulation employing external light having a narrow pulse width and capable of performing active mode-locking operation with excellent jitter characteristics can be provided. The wavelength-tunable light source apparatus can also achieve high accuracy in wavelength determination enabled by excellent jitter characteristics.

Embodiments of the present invention are described below with reference to the drawings.

Figure 1:
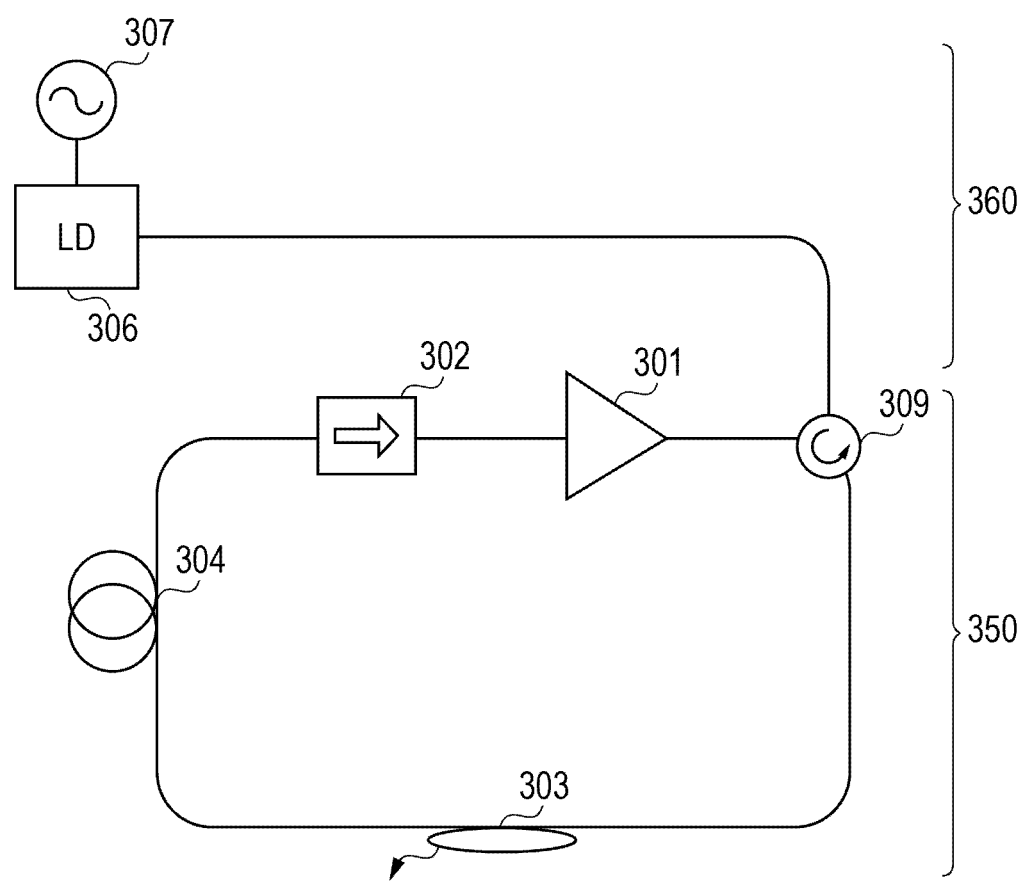
FIG. 1 is a diagram that illustrates one example wavelength-tunable light source apparatus according to an embodiment.

FIG. 1 is a diagram that illustrates one example wavelength-tunable light source apparatus according to an embodiment.

The light source apparatus illustrated in FIG. 1 mainly includes a first light source apparatus 350 and a second light source apparatus 360. The first light source apparatus 350 includes a resonator that incorporates an optical amplification medium for amplifying light and a waveguide having wavelength dispersion and can change an oscillation wavelength. The second light source apparatus 360 is connected to the waveguide and introduces pulsed light as modulation light to the first light source apparatus 350.

The first light source apparatus 350 includes an optical amplification medium 301, an isolator 302, an output coupler 303, a waveguide 304 having wavelength dispersion, and a circulator 309 and forms a ring resonator by connecting these components using an optical waveguide. The isolator 302 is optional.

The optical amplification medium 301 can be a semiconductor optical amplifier (SOA), for example. Basically, a semiconductor optical amplifier is the one in which a resonator is removed from a semiconductor laser and utilizes an optical amplification process, and it has a structure that suppresses reflection at its end faces to avoid it from configuring a resonator. The optical amplification medium 301 is connected to a direct-current power supply (not illustrated) and receives an injected electric current that allows carriers sufficient to cause the optical amplification medium 301 to oscillate as a mode-locking laser.

The second light source apparatus 360 includes a semiconductor laser 306 and a power supply 307 for applying a voltage thereto. The power supply 307 can be a power supply capable of applying a voltage in which an alternating-current component and a direct-current component are superimposed using a bias tee (bias-T).

The second light source apparatus 360 is configured to generate pulsed light as modulation light to be introduced to the first light source apparatus 350. This modulation light (pulsed light) is used in controlling an oscillation wavelength of the first light source apparatus 350 employing active mode locking using cross-gain modulation. In addition, the pulse width of the modulation light is narrower than the duration of a half period of a driving signal for generating modulation light, and pulsed light having a specific narrow pulse width is generated.

Next, operation of the wavelength-tunable light source apparatus using the first light source apparatus and the second light source apparatus according to an embodiment is described.

An active mode-locking operation is performed by providing periodical modulation to a gain of the optical amplification medium 301 in the resonator forming the first light source apparatus 350. A condition for the mode locking operation is that a modulation frequency f subjected to mode locking (or mode-locking frequency f) determining the period is an integral multiple of FSR determined by the length of the resonator and a refractive index in the resonator. In the case of a ring resonator, the modulation frequency f can be expressed by the following expression (1):

$$f = N\frac{c}{n(\lambda)L} \quad \text{Expression (1)}$$

where L is the length of the resonator, $n(\lambda)$ is the refractive index, c is the speed of light, and N is a positive integer.

For a Fabry-Perot resonator, it can be expressed by the following expression (2):

$$f = N\frac{c}{2n(\lambda)L} \quad \text{Expression (2)}$$

Here, because the resonator includes the waveguide 304 having wavelength dispersion, the refractive index is $n(\lambda)$ having dispersion in which the wavelength is a variable, and the value of the modulation frequency f varies with the central oscillation wavelength. Therefore, the oscillation wavelength determined by active mode locking can be changed by changing the modulation frequency f. This is a principle of dispersion tuning.

Accordingly, accuracy in determining the value of the modulation frequency f relates to accuracy in selecting the oscillation wavelength for the wavelength-tunable light source apparatus. In high-speed wavelength tuning at several hundred kHz or above using the dispersion tuning process, the modulation frequency f can be a higher value. The dispersion tuning process employing cross-gain modulation using external light as modulation light is suited for such high-speed wavelength tuning.

For the technique disclosed in Non Patent Literature 2 described in the Related Art, light obtained by modulating continuous light employing a modulator, such as EOM, is used as modulation light, it is introduced into the resonator including the SOA, loss is provided thereto, and mode locking is obtained. Therefore, pulsed light to which the waveform of a driving electric current being a modulation signal is strongly reflected is generated by the resonator.

In contrast to this, for the embodiments, modulation light generated by the second light source apparatus is configured to have a specific pulse width (have a duration narrower than a duration of a half period of a driving signal for generating modulation light). The modulation light generated by the second light source apparatus corresponds to pulsed light that oscillates in a duration narrower than that of the waveform of a driving signal when a so-called gain switching laser is used.

Accordingly, for cross-gain modulations using these two kinds of pulsed light as modulation light, accuracy in determining the mode locking frequency f when a gain switching laser is used is better. The reasons are described below with reference to FIGS. 13A to 13C and 2A to 2C.

Figure 13A:
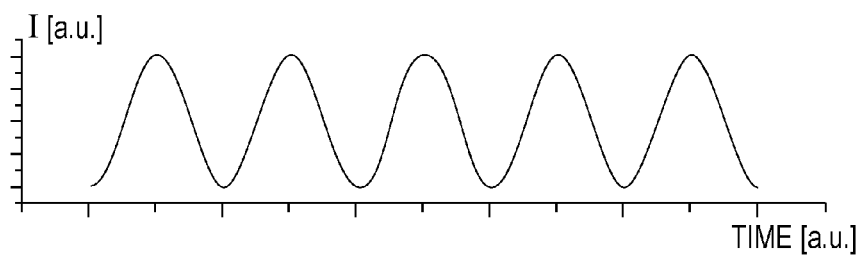
FIGS. 13A to 13C are graphs illustrating relationships between each of a driving signal for generating modulation light and the modulation light and pulsed light obtained by oscillation for a traditional wavelength-tunable light source apparatus.
Figure 13B:
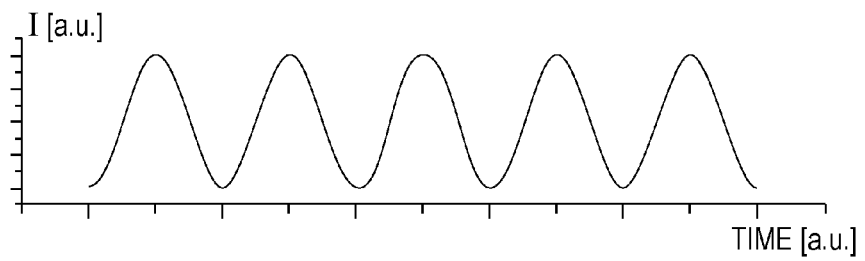
Figure 13C:
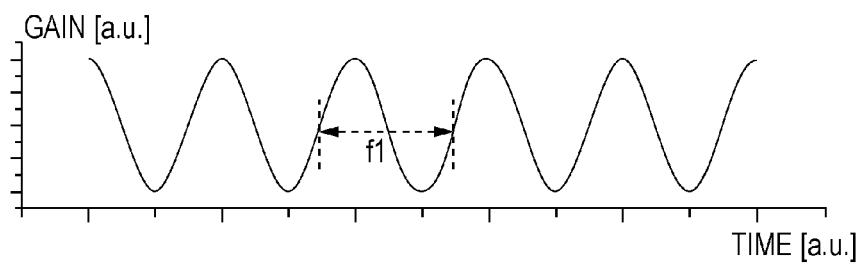

FIGS. 13A to 13C are graphs illustrating relationships between each of a driving signal for generating modulation light and the modulation light and a gain of pulsed light obtained by oscillation. In this case, light in which continuous light is modulated by a modulator is used as modulation light. FIG. 13A illustrates a time waveform of a driving electric current, FIG. 13B illustrates a time waveform for the intensity of modulation light, and FIG. 13C illustrates a time waveform of a gain when a gain medium (optical amplification medium) is subjected to cross-gain modulation using FIG. 13B.

Figure 2A:
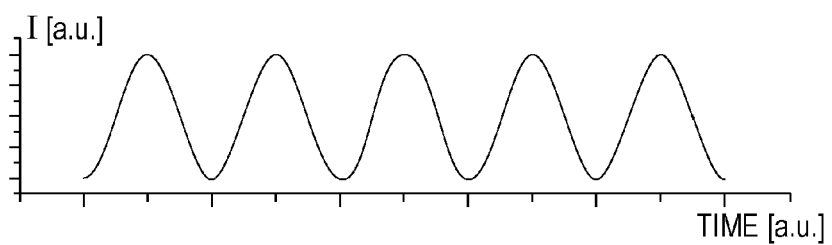
FIGS. 2A to 2C are graphs illustrating relationships between each of a driving signal for generating modulation light and the modulation light and pulsed light obtained by oscillation for the wavelength-tunable light source apparatus according to an embodiment.
Figure 2B:
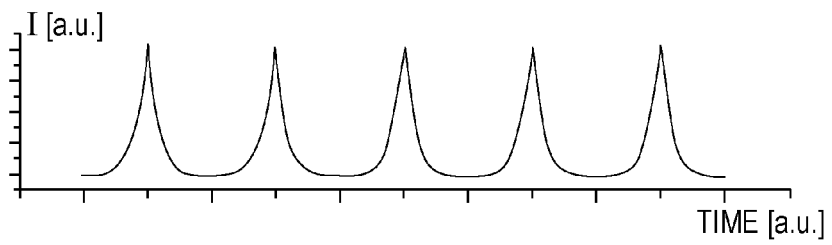
Figure 2C:
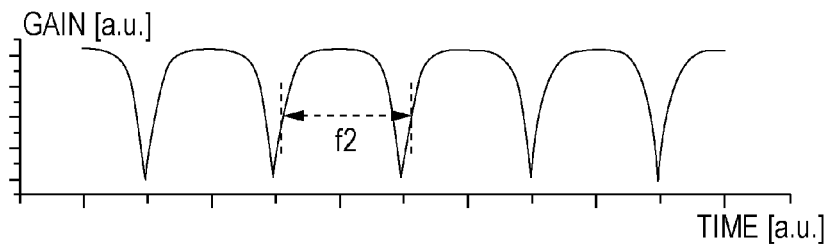

FIGS. 2A to 2C are graphs when pulsed light from a gain switching laser is used as modulation light. FIG. 2A illustrates a time waveform of a driving electric current, FIG. 2B illustrates a time waveform for the intensity of modulation light, and FIG. 2C illustrates a time waveform of a gain when a gain medium is subjected to cross-gain modulation using FIG. 2B. The waveform illustrated in FIG. 13B is the same as that of a driving electric current illustrated in FIG. 13A, whereas the waveform illustrated in FIG. 2B is a pulse waveform oscillating in a duration narrower than a half period of the waveform of a driving electric current illustrated in FIG. 2A.

When an optical amplification medium (gain medium) is subjected to cross-gain modulation using such different pulsed light as modulation light, the gain illustrated in FIG. 2C rises more sharply than that illustrated in FIG. 13C. In other words, the slope of an increase in gain in FIG. 2C is steeper.

Accordingly, when the mode locking frequency defined by f1 in FIG. 13C and that defined by f2 in FIG. 2C are discussed, fluctuations of the value of f2 are smaller than those of f1. That is, for the case of FIG. 2C, jitter characteristics in active mode locking are improved, and reliability of mode locking frequency is improved. In addition, in terms of wavelength sweeping by dispersion tuning, accuracy of wavelength selectivity is improved.

The value of integral of the gain of FIG. 2C is larger than that of FIG. 13C. Therefore, the quantity of output light in laser oscillation for FIG. 2C is also larger.

In consideration of these benefits, no matter how narrow the pulse width of modulation light is, cross-gain modulation by induced emission occurs in a gain medium. However, if the pulse width is too narrow, the peak value of the quantity of light in pulse is high and this may cause undesired effects, such as extension of the pulse width during propagation along the waveguide or the occurrence of non-linear effects in the gain medium.

Accordingly, a useful pulse width is the one at which the slope of a gain enabling sufficient effects of improving jitter can be formed with respect to a frequency modulation range in dispersion tuning.

In light of these respects, it is useful that the slope of an intensity curve at (the place of) a half value of a maximum value of intensity defining the pulse width of modulation light be larger than the slope of an intensity curve at (the place of) a half value of a maximum value of intensity in (signal) waveform of a driving electric current. The second light source apparatus for generating modulation light having a narrow pulse width can be made of a gain switching semiconductor laser or a mode locking laser. The embodiments also encompass mode in which the second light source apparatus is made of a wavelength-tunable semiconductor laser.

In the foregoing, an example in which a semiconductor optical amplifier (SOA) is used as an optical amplification medium is described. Other examples of the optical amplification medium can include a rare earth doped (ion doped) optical fiber containing, for example, erbium or ytterbium, and an optical fiber doped with coloring matter for use in amplification.

A rare earth doped optical fiber is useful in high gain and good noise characteristics. With a coloring matter doped optical fiber, when fluorescent dye or its host material is appropriately selected, a tuning wavelength can be selected from increased options.

A semiconductor optical amplifier is useful in that it is small and can be controlled at high speeds. As the semiconductor optical amplifier, both a reflective type and a traveling-wave type can be used. The semiconductor optical amplifier can be made of a compound semiconductor forming a general semiconductor laser, and examples thereof can include indium gallium arsenide (InGaAs), indium arsenide phosphide (InAsP), gallium aluminum antimonide (GaAlSb), gallium arsenide phosphide (GaAsP), aluminum gallium arsenide (AlGaAs), and gallium nitride (GaN) compound semiconductors. The semiconductor optical amplifier can be selected from among ones having gain central wavelengths 840 nm, 1060 nm, 1300 nm, and 1550 nm, depending on the application of the light source.

For the embodiments, as an optical waveguide, basically, the one having the function of enabling light to propagate therethrough and having wavelength dispersion can be used. To minimize external effects, a slab waveguide or an optical fiber that enables light to propagate therethrough while confining light therein can be used. A typical waveguide that enables confined light to propagate therethrough includes a section having a high refractive index (core) and a section having a low refractive index (clad). To achieve small-range FSR, the length of the resonator can be relatively long. From this respect, an optical fiber can be used. This is because from the principle of dispersion tuning, small-range FSR leads to a small pitch in selecting an oscillation wavelength. Examples of the optical fiber can include one employing quartz ($SiO_2$) glass, one employing plastic, and one employing both quartz and plastic.

For the embodiments, a dispersion value of wavelength dispersion of the optical waveguide can be any specific dispersion value in the range of a normal dispersion value (negative) to an anomalous dispersion (positive), depending on the used optical amplification medium, a target sweeping speed, and a target sweeping wavelength range.

Examples of a resonator that can be used in the embodiments can include a ring resonator, which is previously described, and an optical resonator having a pair of parallel planes as reflection planes at both ends (so-called Fabry-Perot resonator). From the viewpoint that traveling waves in a resonator are in a uniform direction, a ring resonator including an isolator can be used. From the viewpoint of a light source apparatus having no isolator and made at low cost, a Fabry-Perot resonator can be used.

The embodiments of the present invention are specifically described in detail below.

First Embodiment

A wavelength-tunable light source apparatus is described that performs dispersion tuning employing cross-gain modulation by introducing modulation light generated by a gain switching laser to a ring resonator using a fiber from the outside and that has a central sweep wavelength of 1.06 μm band.

Figure 3:
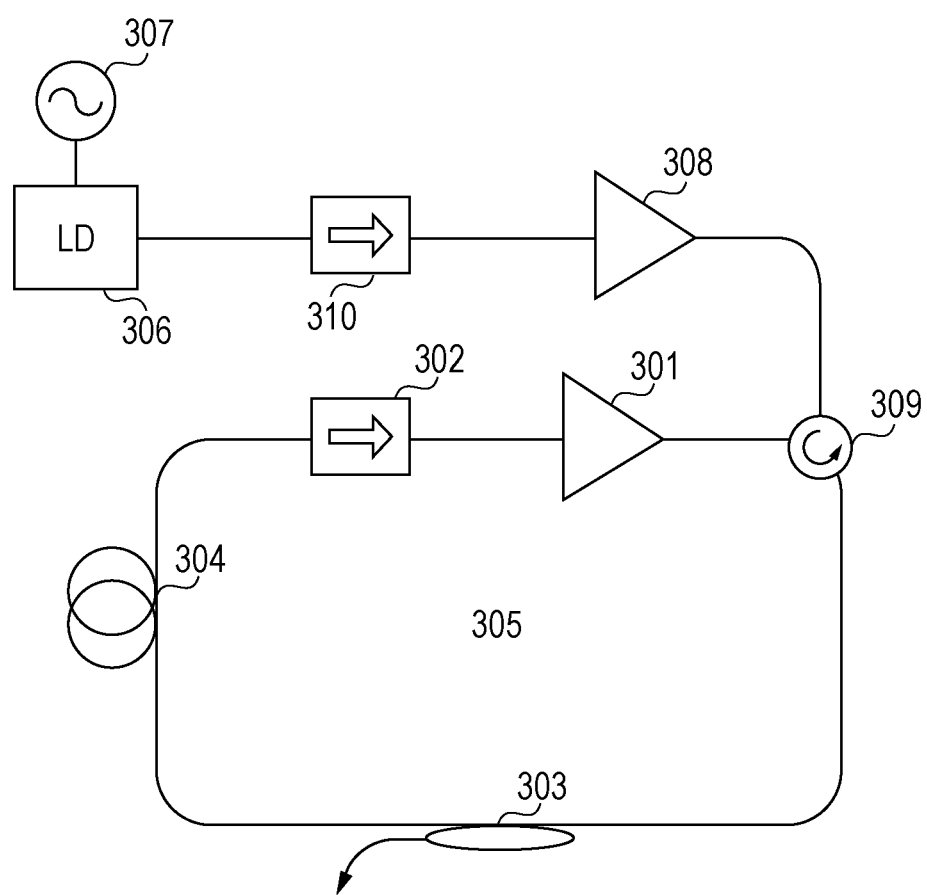
FIG. 3 is a diagram that illustrates another example of a wavelength-tunable light source apparatus according to an embodiment.

The light source apparatus according to the present embodiment is illustrated in FIG. 3. The light source apparatus includes a ring resonator 305 made up of a optical amplification medium 301, an isolator 302, an output coupler 303, and a dispersion fiber 304 for use in providing dispersion.

The light source apparatus further includes a semiconductor laser (LD) 306 outside the ring resonator 305 and performs a gain switching operation by applying a voltage in which a direct-current component and an alternating-current component are superimposed from a power supply 307 in the vicinity of a threshold electric current of the semiconductor laser 306. After external modulation light generated by the semiconductor laser 306 passes through an isolator 310, its light quantity is increased by an optical amplification medium 308. The external modulation light is introduced to the ring resonator 305 through a circulator 309. The external modulation light propagates through an active layer of the optical amplification medium 301, and carriers in the active layer are consumed by induced emission, thus losing the gain of the optical amplification medium 301 and thereby performing cross-gain modulation.

Each of the optical amplification media 301 and 308 according to the present embodiment is the one in which a gain central wavelength is in 1.06 µm band. Each of the optical amplification media 301 and 308 is in a state where a direct-current voltage is applied and it has a sufficient gain. The operating wavelength band of each of the isolators 302 and 307, the output coupler 303, and the circulator 309 is also 1.06 µm band.

The dispersion value of the dispersion fiber 304 is approximately −50 (ps/km·nm), and the length thereof is approximately 100 m. At this time, when active mode locking is performed at the mode locking frequency f around 1 GHz and the frequency f is changed about ±500 kHz, a tuning wavelength width of approximately 50 nm can be obtained from the principle of dispersion tuning.

The external modulation light capable of performing such frequency modulation is generated by the semiconductor laser 306. When the threshold of the semiconductor laser 306 is approximately 40 mA, applying a voltage in which a voltage corresponding to the direct-current component 30 mA and that corresponding to the alternating-current component ±20 mA are superimposed from the power supply 307 enables the semiconductor laser 306 to perform a gain switching operation.

When a driving signal of approximately 1 GHz (gigahertz) sine wave, that is, a current waveform of a half-value width of approximately 500 ps (picoseconds) and a period of approximately 1 GHz is applied to the semiconductor laser 306 from the power supply 307, a repetitive pulse train of a half-value width of approximately 100 ps and a period of approximately 1 GHz is generated by the semiconductor laser 306 being in a gain switching operation state.

Figure 8A:
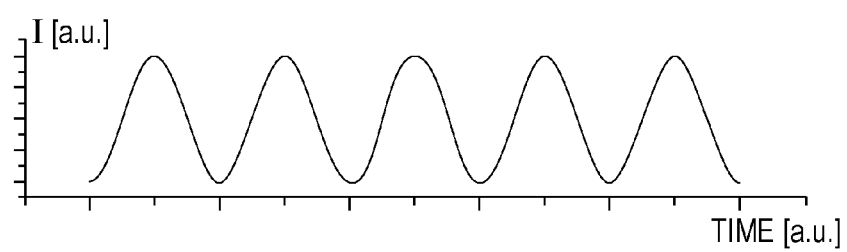
FIGS. 8A and 8B are graphs illustrating relationships between a driving signal for generating modulation light and the modulation light for the wavelength-tunable light source apparatus according to an embodiment.
Figure 8B:
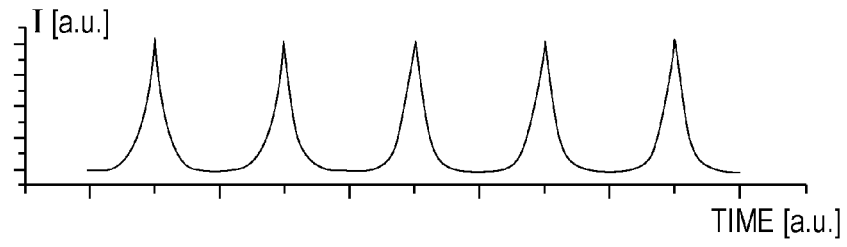

This behavior is illustrated in FIGS. 8A and 8B. The electric current waveform is illustrated in FIG. 8A, and light of a pulse width narrower than its half-value width is illustrated in FIG. 8B. Additionally, when the frequency of the power supply 307 is subjected to frequency modulation in the range of ±500 kHz with respect to 1 GHz, desired modulation light can be generated.

From the viewpoint of efficient cross-gain modulation on the optical amplification medium 301, the semiconductor laser 306 can be a wavelength-tunable LD.

In addition, the semiconductor laser 306 can have a wavelength shorter than the oscillation wavelength at the ring resonator 305.

Dispersion tuning having good jitter characteristics can be achieved by performing active mode locking employing cross-gain modulation on the optical amplification medium 301 in the ring resonator 305 using the above-described pulsed light.

As a result, light with a tunable oscillation wavelength is output from the output coupler 303.

Figure 9A:
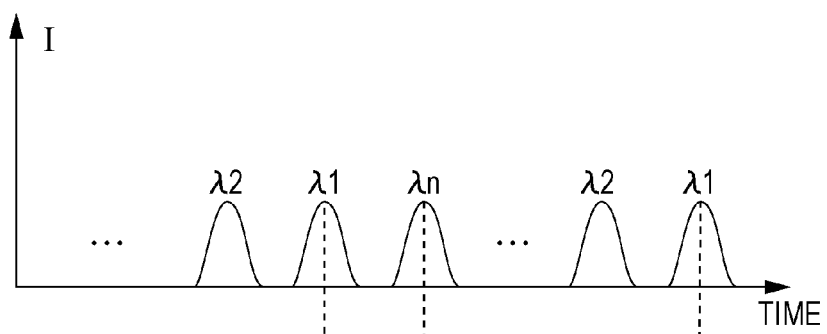
FIGS. 9A and 9B are graphs illustrating output light subjected to wavelength sweeping performed by the wavelength-tunable light source apparatus according to an embodiment.
Figure 9B:
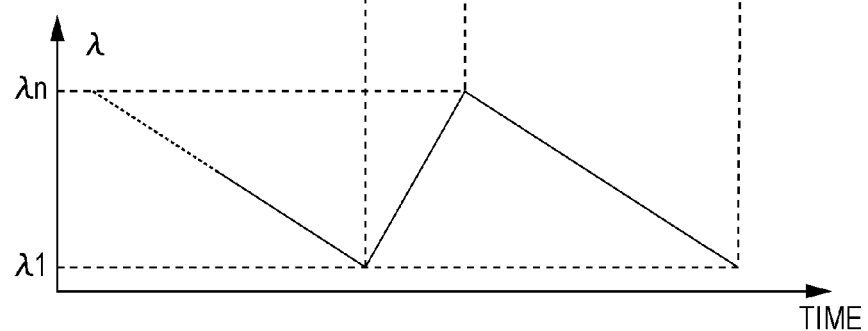

Repeating sweeping the frequency of the power supply 307 in the above-described range enables outputting light subjected to repetitive sweeping from $\lambda 1$ to $\lambda n$ as illustrated in FIGS. 9A and 9B from the output coupler 303.

Second Embodiment

A light source apparatus according to the present embodiment has jitter characteristics in a gain switching operation improved by introducing continuous light to the semiconductor laser 306, which is the light source of external modulation light for the wavelength-tunable light source apparatus illustrated in the first embodiment.

Figure 4:
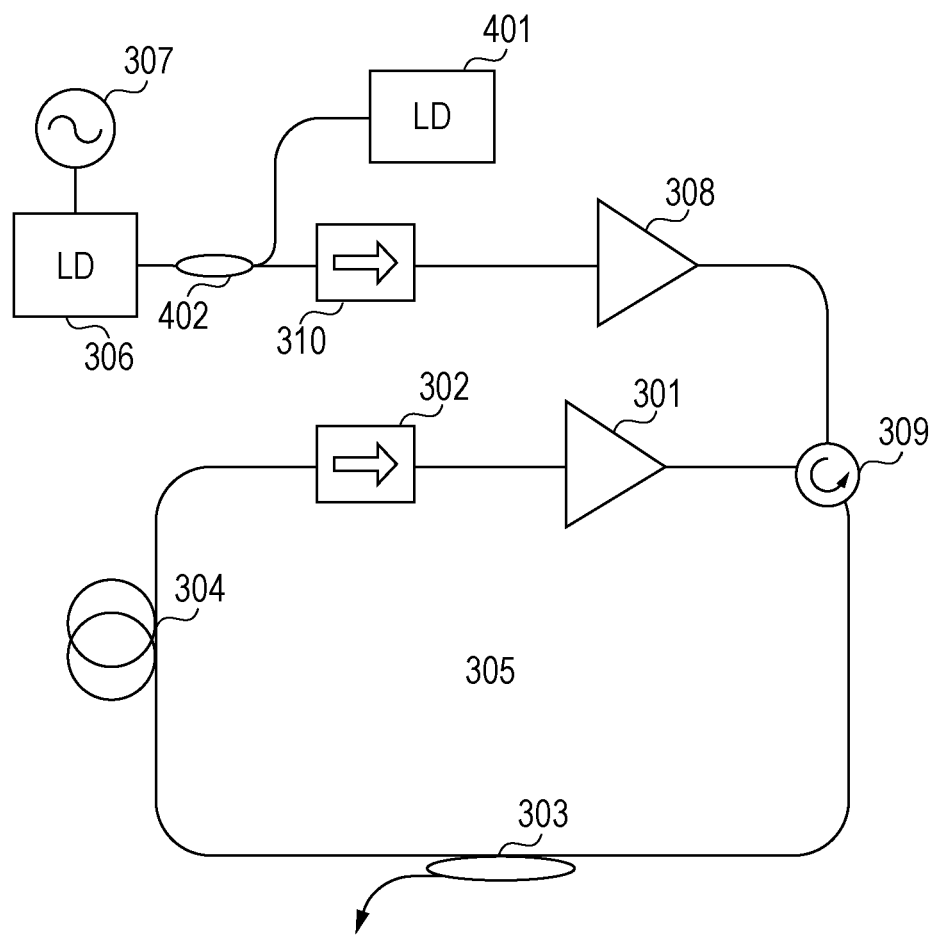
FIG. 4 is a diagram that illustrates another example wavelength-tunable light source apparatus according to an embodiment.

In FIG. 4, reference numeral 401 indicates a semiconductor laser that generates continuous light, reference numeral 402 indicates a coupler, and other components are substantially the same as in the first embodiment. The light source apparatus has a configuration in which control light is introduced to the second light source apparatus 360 (including the semiconductor laser 306) from a third light source apparatus 401.

The wavelength-tunable light source apparatus illustrated in FIG. 4 is an apparatus in which jitter characteristics of pulse oscillation are improved by introducing continuous light having a wavelength slightly shorter than the oscillation wavelength from the outside to the LD for performing a gain switching operation.

Introducing continuous light having a wavelength slightly shorter than the oscillation wavelength of the semiconductor laser 306 from the semiconductor laser 401 (third light source apparatus) enables reduction in the amount of generation of amplified spontaneous emission (ASE) light in the semiconductor laser 306. Therefore, jitter characteristics of pulse oscillation caused by fluctuation in carriers in a gain switching operation are improved. Accordingly, dispersion tuning performed on the ring resonator 305 using pulsed light occurring in the above-described way supplied from the semiconductor laser 306 further improves jitter characteristics in comparison with the apparatus illustrated in the first embodiment, and thus the wavelength-tunable light source apparatus having excellent wavelength selectivity can be provided.

From the viewpoint of efficiently achieving the above-described benefits, the semiconductor laser 401 can be a wavelength-tunable laser.

Third Embodiment

A light source apparatus according to the present embodiment has jitter characteristics in a gain switching operation improved by feeding part of light of the semiconductor laser 306 back to the semiconductor laser 306, which is the light source of external modulation light for the wavelength-tunable light source apparatus illustrated in the first embodiment.

Figure 5:
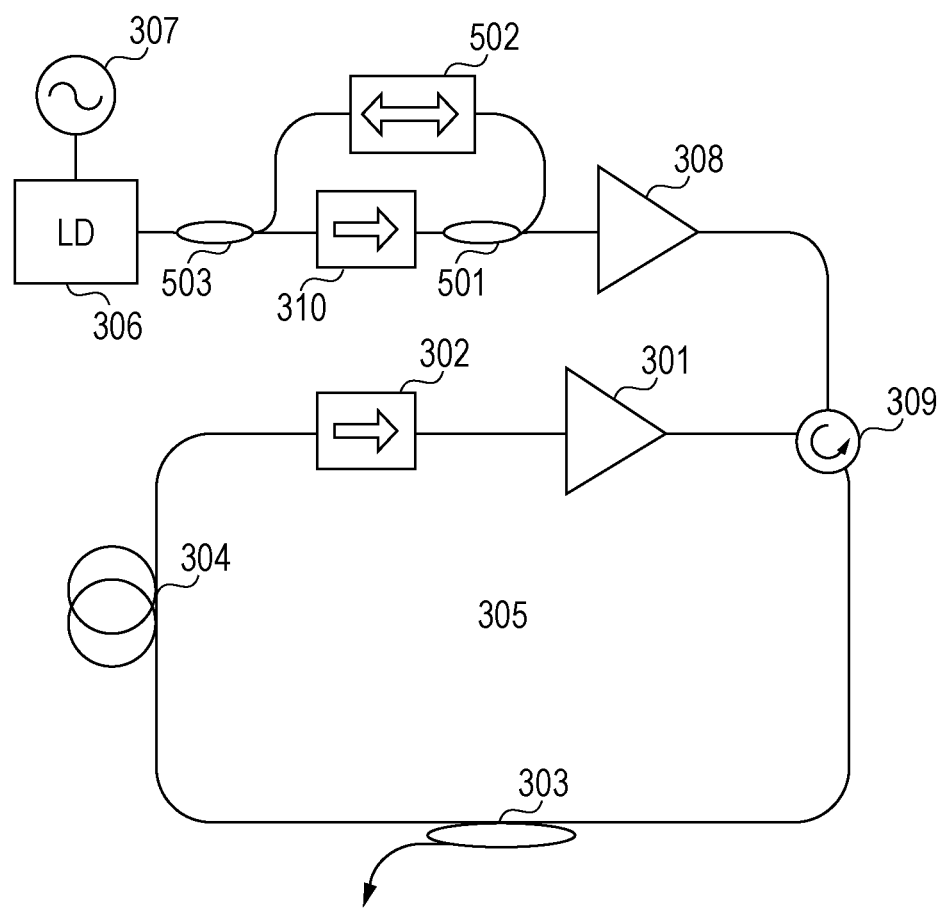
FIG. 5 is a diagram that illustrates another example wavelength-tunable light source apparatus according to an embodiment.

In FIG. 5, reference numerals 501 and 503 indicate couplers, reference numeral 502 indicates a fiber stretcher, and other components are substantially the same as in the first embodiment.

The wavelength-tunable light source apparatus illustrated in FIG. 5 is an apparatus in which jitter characteristics of pulse oscillation are improved by feeding part of the LD performing a gain switching operation back to the LD.

Part of intensity of pulsed light generated by the semiconductor laser 306 performing a gain switching operation is extracted by the coupler 501 (separation unit). A delay path containing the fiber stretcher 502 provides the extracted part with a desired delay time and then feeds it back to the semiconductor laser 306 through the coupler 503.

The desired delay time used here is described with reference to FIG. 10.

Figure 10:
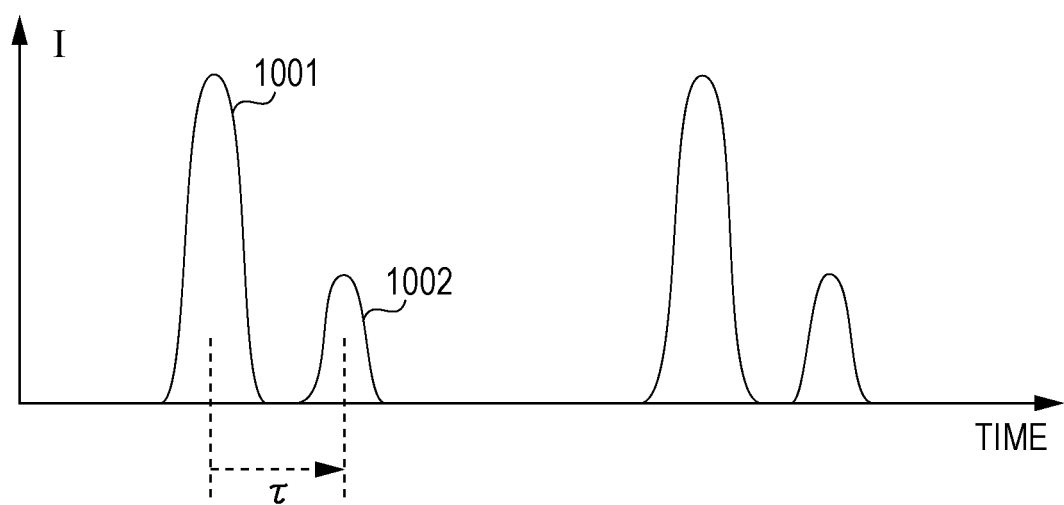
FIG. 10 is a graph illustrating a relationship between pulsed light caused by gain switching operation and feedback light.

In FIG. 10, reference numeral 1001 indicates pulsed light in a gain switching operation of the semiconductor laser 306 and indicates the timing of its oscillation. The length of the delay path is adjusted such that feedback light 1002 is fed back to the semiconductor laser 306 immediately before the oscillation of the pulsed light 1001 by time $\tau$. The time $\tau$ is approximately 0 to 100 ps (picoseconds). At this time, part of carriers in the semiconductor laser 306 is consumed by induced emission caused by the feedback light 1002, and the slope of the density of carries exceeding the oscillation threshold is sharp. Therefore, jitter characteristics in a gain switching operation are improved.

Accordingly, dispersion tuning performed on the ring resonator 305 using pulsed light occurring in the above-described way supplied from the semiconductor laser 306 further improves jitter characteristics in comparison with the apparatus illustrated in the first embodiment, and thus the wavelength-tunable light source apparatus having excellent wavelength selectivity can be provided.

In comparison with the case where jitter characteristics of a gain switching laser are improved by the use of continuous light as in the second embodiment, because the timing for feedback is important as described above, a wavelength-control condition of a slightly shorter than the oscillation wavelength is relieved.

In addition, because an external light source apparatus is not disposed, the present embodiment is useful in terms of cost reduction, in comparison with the apparatus illustrated in the second embodiment.

Fourth Embodiment

A light source apparatus according to the present embodiment has jitter characteristics in a gain switching operation improved by feeding part of light output from the ring resonator 305 to the semiconductor laser 306, which is the light source of external modulation light for the wavelength-tunable light source apparatus illustrated in the first embodiment.

Figure 7:
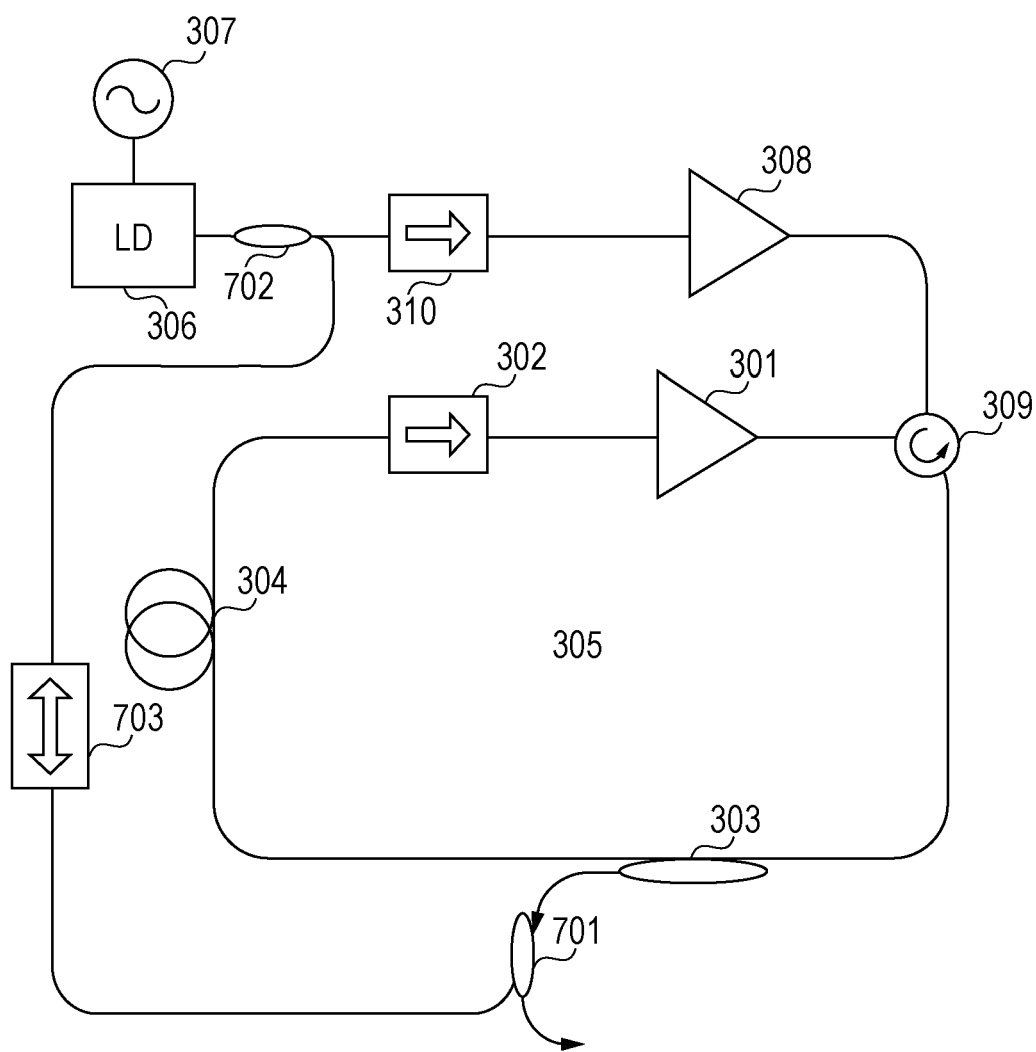
FIG. 7 is a diagram that illustrates another example wavelength-tunable light source apparatus according to an embodiment.

In FIG. 7, reference numerals 701 and 702 indicate couplers, reference numeral 703 indicates a fiber stretcher, and other components are substantially the same as in the first embodiment.

As described in the third embodiment, feeding pulsed light back to the semiconductor laser 306 at appropriate timing enables improvement in jitter in a gain switching operation. For the present embodiment, part of intensity of light output from the output coupler 303, the light being the output light from the wavelength-tunable light source apparatus, is extracted by the coupler 701.

A delay path containing the fiber stretcher 703 provides the extracted light with a desired delay time. The light is fed back to the semiconductor laser 306 through the coupler 702. The desired delay time used here is the same as the one described in the third embodiment with reference to FIG. 10. The oscillation wavelength of the semiconductor laser 306 and the wavelength of light output from the ring resonator 305 are different, and the occurrence of parasitic oscillation induced by feedback light in the semiconductor laser 306 can be reduced. This can reduce effects in which the pulsed light 1001 and the feedback light 1002 overlap each other in FIG. 10, and the limitation on accuracy in the desired delay time is relieved. It is useful that the wavelength band of light output from the ring resonator 305 be contained in the gain band of the semiconductor laser 306.

Fifth Embodiment

An example in which the wavelength-tunable light source apparatus according to at least one of the embodiments is used in a swept-source optical coherence tomography (SS-OCT) apparatus is described.

Figure 6:
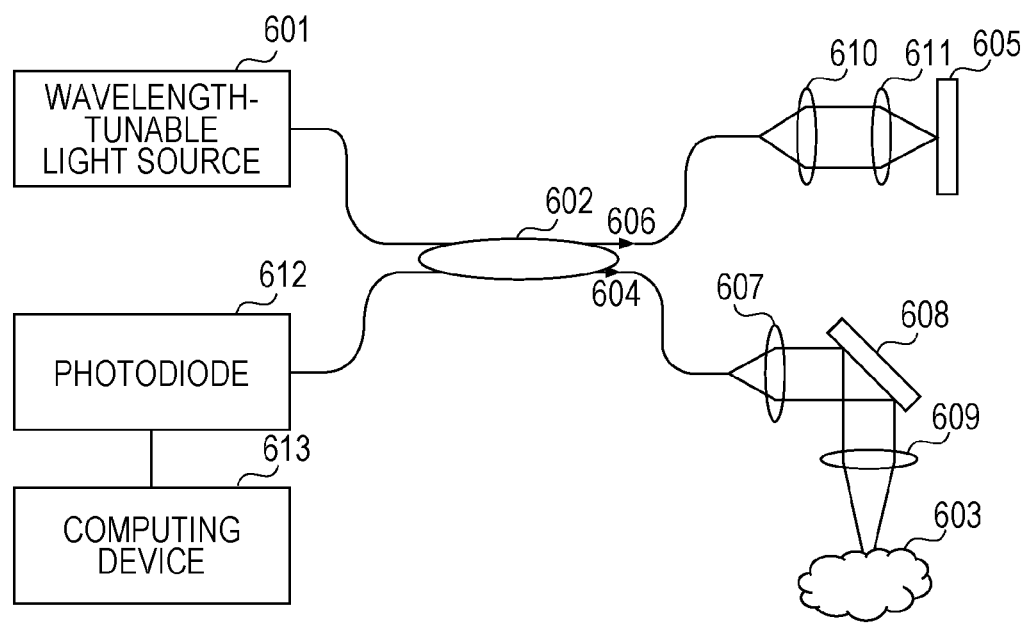
FIG. 6 is a diagram that illustrates one example optical coherence tomography apparatus using the wavelength-tunable light source apparatus according to an embodiment.

FIG. 6 is a diagram of a SS-OCT apparatus using the wavelength-tunable light source apparatus according to at least one of the embodiments.

In the SS-OCT apparatus illustrated in FIG. 6, light from a wavelength-tunable light source 601 (light source unit) is divided into sample light 604 to be guided to an object 603 through a coupler 602 and reference light 606 to be guided to a fixed mirror (reference mirror) 605. After the division, the sample light 604 is guided to the object 603 through a collimator lens 607, a scanning mirror 608, and an objective lens 609, thereby radiating the object 603 with the light.

Reflected light having information indicating the depth of the object 603 returns through an optical path that was used in reaching the object 603 to the coupler 602. The objective lens 609, scanning mirror 608, and collimator lens 607 form an object measurement unit.

The reference light 606 passes through a collimator lens 610 and an objective lens 611 and is then reflected by the fixed mirror (reference mirror) 605. The reflected light returns along an optical path that was used in reaching the reference mirror 605 to the coupler 602 (interference unit). The reference mirror 605, objective lens 611, and collimator lens 610 form a reference unit, and it is configured to transmit reflected light to the coupler (interference unit) 602.

The reference light 606 returned to the coupler 602 and the sample light (reflected light) 604 are guided to a photodiode (optical detection unit) 612 and generate an interference signal. A computing device (image processing unit) 613 rearranges the interference signal based on a light source scanning signal and performs signal processing centered on Fourier transform. In this way, a tomographic image in the depth direction is obtainable. That is, a tomographic image of an object is obtainable on the basis of interference light detected by the photodiode 612.

The use of the wavelength-tunable light source according to the embodiments enables an OCT signal employing light having good wavelength selectivity and can achieve accurately identifying a reflection position of the object 603 in the depth direction.

Degradation in image caused by fluctuation in oscillation wavelength of the light source in obtainment of a tomographic image in the depth direction by the SS-OCT apparatus is reduced, and a good-quality image having a good signal-to-noise ratio is obtainable.

The reasons why the SS-OCT apparatus according to the present embodiment can provide a good-quality image are described with reference to FIGS. 11 and 12.

Figure 11:
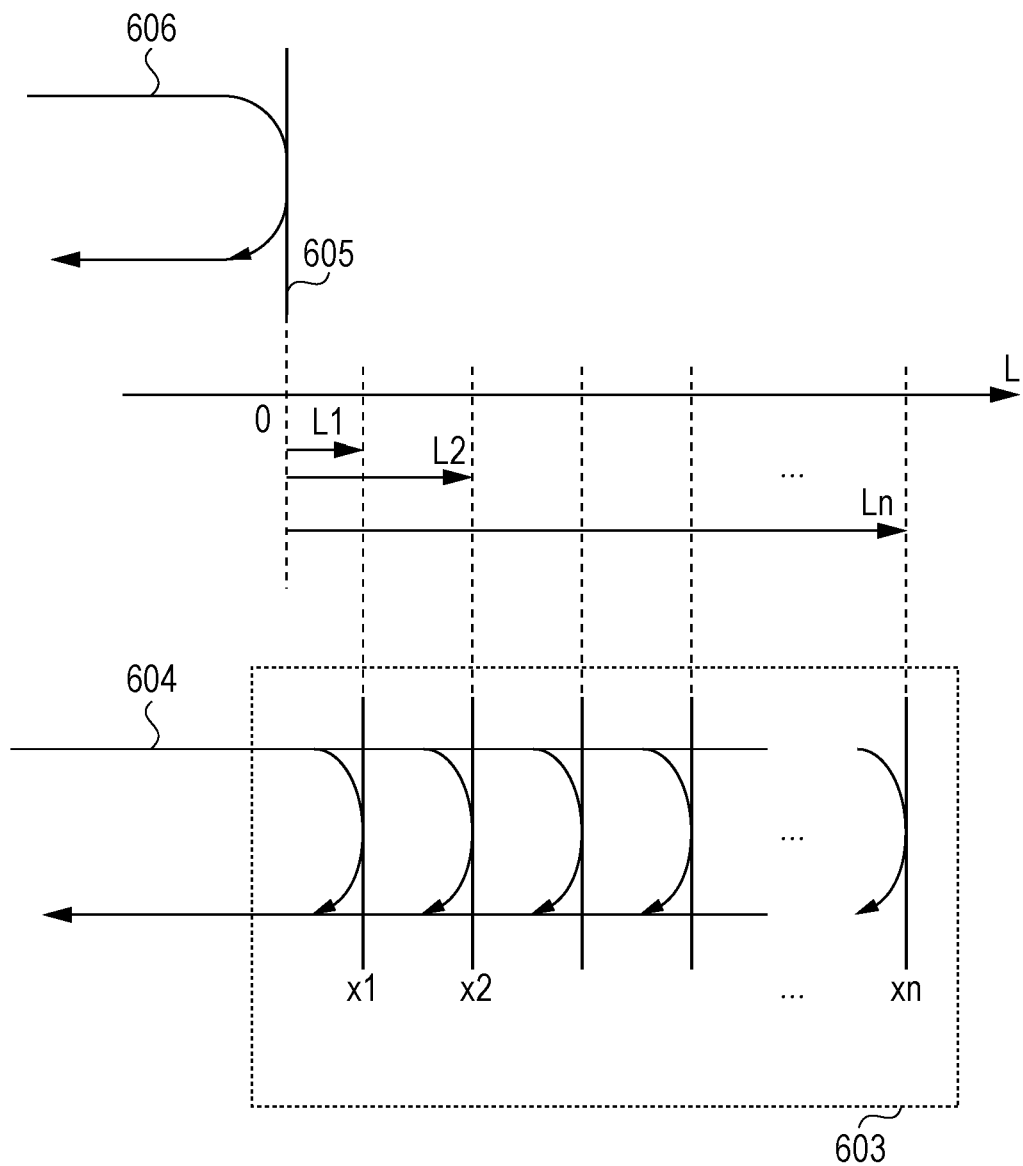
FIG. 11 is a diagram that illustrates reflected light obtained by radiating an object including a laminated structure by the light source apparatus according to an embodiment.

As illustrated in FIG. 11, the inside of the object 603 has a layered structure of x1 to xn. When the sample light 604 and the reference light 606 are combined by the coupler 602, interference signals corresponding to the optical path length differences L1 to Ln associated with x1 to xn of the object 603 are generated with respect to the reference mirror 605.

The light combined by the coupler 602 is received by the photodiode 612. When this light is observed by an oscilloscope, an interference waveform illustrated in FIG. 12 is obtained. The optical path length difference L is calculated by performing Fourier transform on this waveform, and x1 to xn being the reflected positions within the object 603 are identified. In this way, the SS-OCT apparatus obtains a tomographic image in the depth direction.

Here, whether the interference waveform is a peak or valley corresponds to whether the interference condition is that the optical path length difference L is strengthen or that it is weakened with respect to the pulse central wavelength.

Figure 12:
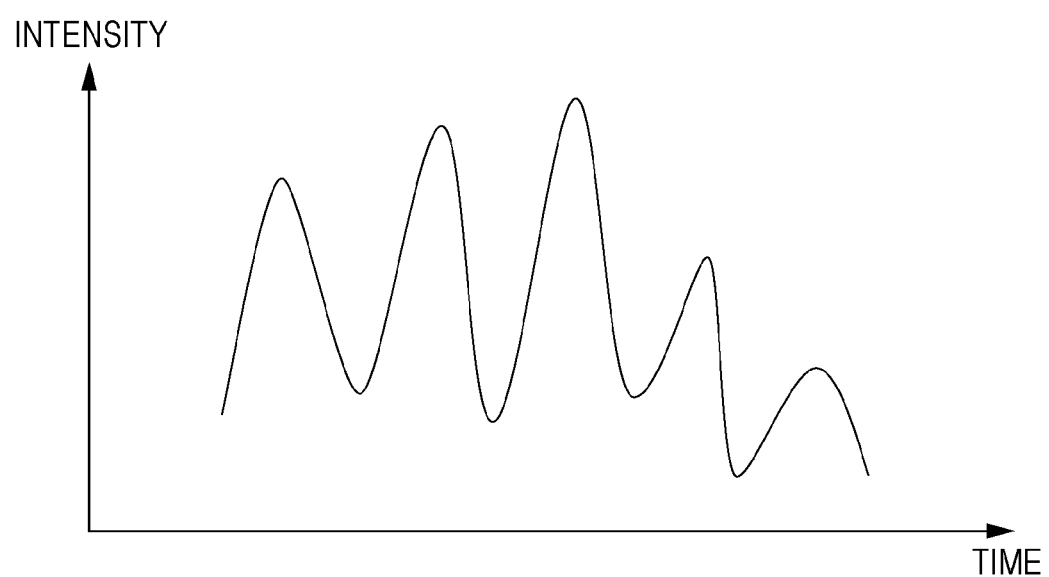
FIG. 12 is a graph that illustrates a waveform obtained by observation of coherent light by an oscilloscope.

That is, fluctuation in central wavelength in sweeping the wavelength of the light source corresponds to fluctuation in interference waveform illustrated in FIG. 12. As a result, the S/N ratio in Fourier transform is degraded, and the S/N ratio for a tomographic image obtained by the SS-OCT apparatus is also degraded. Accordingly, the use of the wavelength-tunable light source apparatus having good wavelength selectivity in the SS-OCT apparatus enables the obtainment of a good-quality image having a good S/N ratio.

The wavelength-tunable light source apparatus according to the embodiments can be applied in fields in which a wavelength-tunable light source apparatus can be used, such as the communication network field and the field for testing apparatuses.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-005182 filed Jan. 13, 2010, which is hereby incorporated by reference herein in its entirety.

What is claimed is:

1. A wavelength-tunable light source apparatus, comprising:
   a first light source apparatus configured to change an oscillation wavelength, wherein the first light source apparatus includes a resonator, wherein the resonator includes an optical amplification medium configured to amplify light and a waveguide configured to provide wavelength dispersion; and
   a second light source apparatus connected to the waveguide and configured to use a driving signal to generate a modulation light and to introduce the modulation light to the first light source apparatus, wherein a pulse width of the modulation light has a duration that is shorter than a duration of a half period of the driving signal generating the modulation light, and
   wherein the oscillation wavelength is controlled by active mode locking employing cross-gain modulation using the modulation light.

2. The wavelength-tunable light source apparatus according to claim 1, wherein a slope of an intensity curve at (a place of) a half value of a maximum value of intensity defining the pulse width of the modulation light is larger than a slope of an intensity curve at (a place of) a half value of a maximum value of intensity in (signal) waveform of the driving signal.

3. The wavelength-tunable light source apparatus according to claim 1, wherein the second light source apparatus comprises one of a gain switching semiconductor laser and a wavelength-tunable semiconductor laser.

4. The wavelength-tunable light source apparatus according to claim 1, wherein the first light source apparatus further includes an output coupler and a circulator positioned between the optical amplification medium and the output coupler, wherein the modulation light is introduced to the resonator through the circulator.

5. The wavelength-tunable light source apparatus according to claim 1, wherein a laser uses the driving signal to generate modulation light and a continuous light is introduced to the laser.

6. The wavelength-tunable light source apparatus according to claim 5, wherein the continuous light is introduced to the laser from a third light source apparatus and has a wavelength that is slightly shorter than an oscillation wavelength of the laser.

7. The wavelength-tunable light source apparatus according to claim 1, further comprising:
   a separation unit configured to extract part of light occurring in the second light source apparatus;
   a delay path configured to provide the extracted part of light with a delay; and
   an introduction unit configured to introduce the extracted part of light to the second light source apparatus as control light.

8. The wavelength-tunable light source apparatus according to claim 7, wherein the control light introduced to the second light source apparatus comprises light in which the extracted part of the light occurring in the second light source apparatus is fed back.

9. The wavelength-tunable light source apparatus according to claim 1, further comprising:
   a separation unit configured to extract part of light having the oscillation wavelength from the first light source apparatus;
   a delay path configured to provide the extracted part of light with a delay; and
   an introduction unit configured to introduce the extracted part of light to the second light source apparatus as control light.

10. The wavelength-tunable light source apparatus according to claim 9, wherein the control light introduced to the second light source apparatus comprises light in which the extracted part of the light occurring in the first light source apparatus is fed back.

11. The wavelength-tunable light source apparatus according to claim 1, wherein the waveguide configured to provide wavelength dispersion comprises an optical fiber.

12. The wavelength-tunable light source apparatus according to claim 1, wherein the optical amplification medium of the first light source apparatus comprises a semiconductor optical amplifier.

13. An optical coherence tomography apparatus, comprising:
   a light source unit using a wavelength-tunable light source apparatus according to claim 1;
   an object measurement unit configured to irradiate an object with light from the light source unit and transmit object reflected light from the object;
   a reference unit configured to irradiate a reference mirror with light from the light source unit and transmit reference mirror reflected light from the reference mirror;
   an interference unit configured to cause the object reflected light and the reference mirror reflected light to interfere with each other and output interference light;
   an optical detection unit configured to detect interference light from the interference unit; and
   an image processing unit configured to obtain a tomographic image of the object based on light detected by the optical detection unit.

14. The wavelength-tunable light source apparatus according to claim 13, wherein a slope of an intensity curve at (a place of) a half value of a maximum value of intensity defining the pulse width of the modulation light is larger than a slope of an intensity curve at (a place of) a half value of a maximum value of intensity in (signal) waveform of the driving signal.

15. The optical coherence tomography apparatus according to claim 13, wherein the first light source apparatus further includes an output coupler and a circulator positioned between the optical amplification medium and the output coupler, wherein the modulation light is introduced to the resonator through the circulator.

16. The optical coherence tomography apparatus according to claim 13, wherein a laser uses the driving signal to generate modulation light and a continuous light is introduced to the laser.

17. The wavelength-tunable light source apparatus according to claim 16, wherein the continuous light is introduced to the laser from a third light source apparatus and has a wavelength that is slightly shorter than an oscillation wavelength of the laser.

18. The optical coherence tomography apparatus according to claim 13, further comprising:

a separation unit configured to extract part of light occurring in the second light source apparatus;

a delay path configured to provide the extracted part of light with a delay; and an introduction unit configured to introduce the extracted part of light to the second light source apparatus as control light.

19. The optical coherence tomography apparatus according to claim 13, further comprising:

a separation unit configured to extract part of light having the oscillation wavelength from the first light source apparatus;

a delay path configured to provide the extracted part of light with a delay; and an introduction unit configured to introduce the extracted part of light to the second light source apparatus as control light.

20. A method for a wavelength-tunable light source apparatus, the method comprising:

changing, using a first light source apparatus, an oscillation wavelength, wherein the first light source apparatus includes a resonator, wherein the resonator includes an optical amplification medium configured to amplify light and a waveguide configured to provide wavelength dispersion; and generating, using a second light source apparatus connected to the waveguide and using a driving signal, a modulation light and introducing the modulation light to the first light source apparatus, wherein a pulse width of the modulation light has a duration that is shorter than a duration of a half period of the driving signal generating the modulation light, and wherein the oscillation wavelength is controlled by active mode locking employing cross-gain modulation using the modulation light.

* * * * *